United States Patent [19]

Setsune et al.

[11] Patent Number: 5,731,270
[45] Date of Patent: Mar. 24, 1998

[54] OXIDE SUPERCONDUCTOR AND METHOD AND APPARATUS FOR FABRICATING THE SAME

[75] Inventors: Kentaro Setsune, Sakai; Yo Ichikawa, Moriguchi; Akira Enokihara, Osaka; Masahiro Sakai, Neyagawa, all of Japan

[73] Assignee: Matsushita Electric Industrial Co., Ltd., Japan

[21] Appl. No.: 688,687

[22] Filed: Jul. 29, 1996

Related U.S. Application Data

[60] Continuation of Ser. No. 310,396, Sep. 22, 1994, abandoned, which is a division of Ser. No. 216,401, Mar. 23, 1994.

[30] Foreign Application Priority Data

Mar. 26, 1993 [JP] Japan ................................. 5-068526
Jul. 29, 1993 [JP] Japan ................................. 5-188119

[51] Int. Cl.$^6$ ................................. B05D 5/12; B05D 3/06
[52] U.S. Cl. ................................. 505/320; 505/480; 505/500; 505/742; 427/62
[58] Field of Search ................................. 505/480, 320, 505/500, 742; 427/62

[56] References Cited

FOREIGN PATENT DOCUMENTS

| | | |
|---|---|---|
| 1-133906 | 5/1989 | Japan. |
| 1-161806 | 6/1989 | Japan. |
| 4-092854 | 3/1992 | Japan. |
| 90-04568 | 5/1990 | WIPO. |

OTHER PUBLICATIONS

Irradiation effects of ionized hydrogen on superconducting proprties of Bi–Sr–Ca–Cu–O thin films by Ichikawa et al., "Advanced Materials", 1993 pp. 417–420.
Kato et al, "Phase Transition in $YBa_2Cu_3O_{7-x}$ through hydrogen ion implantation", Jpn. J. Appl. Phys. 27(4) Apr. 1988, pp. L564–L566.
Beyers et al, Nature vol. 340, 24 Aug. 1989, pp. 619–621.

*Primary Examiner*—Roy V. King
*Attorney, Agent, or Firm*—Rossi & Associates

[57] ABSTRACT

An oxide is formed which will form an oxide superconductor containing a Cu-O atomic layer. The oxide is hydrogenated. The oxide is oxidized after it is hydrogenated. The hydrogenation and the oxidization are executed simultaneously with or after the oxide is formed. The hydrogenation and the oxidization improve the superconducting characteristics of the oxide superconductor.

4 Claims, 3 Drawing Sheets

OXIDE SUPERCONDUCTOR AND METHOD AND APPARATUS FOR FABRICATING THE SAME

This is a continuation of application Ser. No. 08/310,396 filed Sep. 22, 1994, now abandoned, which is a division of application Ser. No. 08/216,401, filed Mar. 23, 1994.

BACKGROUND OF THE INVENTION

1. Field of the Invention

This invention relates to a method and an apparatus for fabricating an oxide superconductor such as a superconductor including a Cu-O atomic layer. This invention also relates to an oxide superconductor.

2. Description of the Prior Art

Some oxide superconductors made of crystals including Cu-O atomic layers have transition temperatures Tc higher than the temperature of liquid nitrogen although the details of superconducting mechanisms thereof are unknown. Examples of such high-Tc oxide superconductors are Y-Ba-Cu-O superconductors, Bi-Sr-Ca-Cu-O superconductors, Tl-Ba-Ca-Cu-O superconductors, and Hg-Ba-Ca-Cu-O superconductors. The application of high-Tc oxide superconductors to the field of electronics is expected, and making them into a thin-film configuration and a wire configuration (a line configuration) has been vigorously investigated.

Regarding a fired block (a sintered block), a thin film, and a wire of high-Tc oxide superconductors, it is possible to improve their superconducting characteristics such as their transition temperatures Tc by optimizing processes of making them. In addition, critical current densities in high-Tc oxide superconductors can be improved to a certain extent by optimizing conditions of making them and controlling their crystallinities.

When magnetic flux caused by a current driven through a superconducting body is fixed, the superconducting current can efficiently flow therethrough. To fix the magnetic flux, it is preferable to introduce pinning centers in the superconducting body.

In general oxide superconductors, pinning centers are supposed to be non-superconducting portions such as crystal defects, grain boundaries, and impurities. Pinning mechanisms in high-Tc oxide superconductors are hardly elucidated.

To attain the pinning effect, some methods of fabricating a fired block (a sintered block) or a wire of a high-Tc oxide superconductor add an impurity or control firing conditions (sintering conditions), thereby to deposit an impurity. In the case of a thin film of a high-Tc oxide superconductor, it is known that high-energy particles such as various ions accelerated by a voltage (a potential) of at least several tens of KV or high-speed neutrons are applied to the thin film to cause defects in the crystal of the superconductor or to inject impurities into the crystal of the superconductor. In addition, it is known to apply an energy beam such as an x-ray beam, an electron beam, or an ultraviolet beam to a thin film.

Regarding the effects of the application of such energy beams on a critical current density, detailed investigations have not yet been completed. In some cases, the application of energy beams fails to improve a critical current density. In other cases, the application of energy beams is actually effective to improve a critical current density. The reason for this effect has not yet been elucidated. Generally, such an effect is available in thin films of Y-Ba-Cu-O superconductors but is unavailable in thin films of Bi-Sr-Ca-Cu-O superconductors and Tl-Ba-Ca-Cu-O superconductors. Thus, in thin films of Bi-Sr-Ca-Cu-O superconductors and Tl-Ba-Ca-Cu-O superconductors, the formation of good pinning centers is difficult so that critical current densities are hardly improved.

Oxygen defects in Y-Ba-Cu-O superconductors are unstable. Therefore, Y-Ba-Cu-O superconductors have a problem in stability for a long period of time. Bi-Sr-Ca-Cu-O superconductors, Tl-Ba-Ca-Cu-O superconductors, and Hg-Ba-Ca-Cu-O superconductors are better in stability.

In a first known method of fabricating a thin film of a high-Tc oxide superconductor, a target containing elements for composing superconductor material is placed in a vacuum chamber. Then, a sputtering process is performed on the target within a mixture of argon and oxygen so that a thin film of composite oxides is deposited on a substrate made of, for example, MgO. During the deposition of the thin film, the deposited thin film is crystallized into a superconducting oxide thin film by heating the substrate at a temperature of 600° C. or higher. The deposited thin film may be crystallized by subjecting the substrate to a heat treatment after the deposition of the thin film.

According to a second known method of fabricating a thin film of a high-Tc oxide superconductor, atoms or molecules are evaporated in a vacuum chamber by a suitable vaporizing process such as an MBE process, a pulse laser vaporizing process, a CVD process, or an electron beam vaporizing process. The atoms or molecules react with oxygen introduced into the vacuum chamber, forming a superconducting oxide thin film deposited on a substrate.

Superconducting characteristics of thin films of high-Tc oxide superconductors depend on crystal structures thereof and fabricating conditions. A high-Tc oxide superconductor having a higher crystallinity is better in initial characteristics and long-term stability related to a critical temperature. It has been confirmed that control of an oxygen concentration and also control of heating conditions during or after the formation of a thin film of a high-Tc superconductor can provide good superconducting characteristics.

A wire of a high-Tc oxide superconductor is fabricated as follows. A fired block (a sintered block) of a superconductor is reduced to powder. A metal pipe is charged with the powder. The metal pipe with the powder is elongated and rolled into a superconducting wire. There is a multi-core wire having a metal pipe charged with superconducting thin line cores. Also, there is a tape-shaped superconducting wire.

Generally, material for a high-Tc oxide superconductor changes among an insulator, a semiconductor, and a superconductor in accordance with the amount of oxygen atoms in the crystal thereof and firing conditions (sintering conditions). The formation of a wire of a good high-Tc oxide superconductor usually requires control of firing conditions (sintering conditions) as well as improvement of the crystallinity which occurs in the elongated state. Known methods of fabricating a wire of a high-Tc superconductor include a heating process and a cooling process on a wire to provide the wire with superconducting characteristics.

An effective process of introducing pinning centers has been desired in connection with the previously-mentioned methods of fabricating a thin film and a wire of high-Tc oxide superconductors.

SUMMARY OF THE INVENTION

It is an object of this invention to provide an improved method of fabricating an oxide superconductor such as a superconductor including a Cu-O atomic layer.

It is another object of this invention to provide an improved oxide superconductor.

A first aspect of this invention provides a method of fabricating an oxide superconductor containing a Cu-O atomic layer, comprising the steps of forming an oxide which will form an oxide superconductor containing a Cu-O atomic layer; hydrogenating the oxide; and oxidizing the oxide after the hydrogenating step; wherein the hydrogenating step and the oxidizing step are simultaneous with or after the forming step.

A second aspect of this invention provides a method of fabricating a thin-film oxide superconductor containing a Cu-O atomic layer, comprising the steps of depositing an oxide film which will form a thin-film oxide superconductor containing a Cu-O atomic layer; hydrogenating the oxide film; oxidizing the oxide film after the hydrogenating step; and periodically and sequentially repeating the depositing step, the hydrogenating step, and the oxidizing step; wherein during one period of said repeating, the deposition of the oxide film progresses by a thickness of 100 Å or less.

A third aspect of this invention provides a method of manufacturing a wire including an oxide superconductor containing a Cu-O atomic layer, comprising the steps of preparing oxide powder which will form an oxide superconductor containing a Cu-O atomic layer; charging a sheath with the oxide powder; narrowing and elongating the sheath with the oxide powder into a wire; irradiating the wire with hydrogen ion; and heating the wire in a gas containing oxygen after the irradiating step.

A fourth aspect of this invention provides a method of manufacturing a wire including an oxide superconductor containing a Cu-O atomic layer, comprising the steps of preparing oxide powder which will form an oxide superconductor containing a Cu-O atomic layer; heating the oxide powder in a reactive hydrogen gas; charging a sheath with the oxide powder after the heating step; narrowing and elongating the sheath with the oxide powder into a wire; and heating the wire in a gas containing oxygen after the narrowing and elongating step.

A fifth aspect of this invention provides an apparatus for fabricating a thin-film oxide superconductor containing a Cu-O atomic layer, comprising a vacuum chamber; a vaporization source disposed in the chamber for generating a vapor which will form a thin-film oxide superconductor containing a Cu-O atomic layer; a stage disposed in the chamber; a substrate placed on the stage for deposition of the thin-film oxide superconductor; means for heating the substrate; means for feeding oxygen to the chamber; and means for feeding hydrogen to the chamber to execute hydrogen irradiation.

A sixth aspect of this invention provides an apparatus for manufacturing a wire including an oxide superconductor containing a Cu-O atomic layer, comprising means for winding and moving an original wire which will form a wire including an oxide superconductor containing a Cu-O atomic layer; means for feeding a hydrogen gas; means for activating the hydrogen gas fed by the feeding means into an activated hydrogen gas; means for applying the activated hydrogen gas generated by the activating means to the original wire moved by the winding means; and means for heating the original wire moved by the winding means.

A seventh aspect of this invention provides an oxide superconductor containing a Cu-O atomic layer which is fabricated by a method comprising the steps of forming an oxide which will form an oxide superconductor containing a Cu-O atomic layer; hydrogenating the oxide; and oxidizing the oxide after the hydrogenating step; wherein the hydrogenating step and the oxidizing step are simultaneous with or after the forming step.

DESCRIPTION OF A BASIC PREFERRED EMBODIMENT

Figure 1:
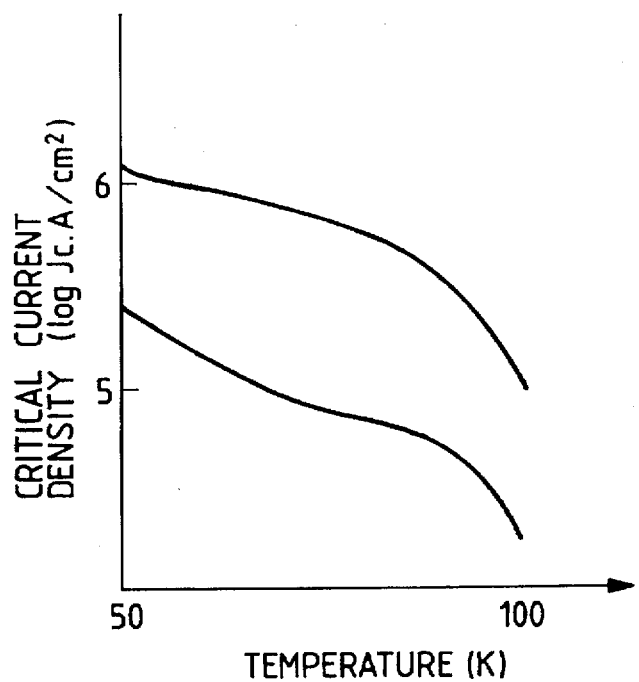
FIG. 1 is a diagram of temperature dependencies of a critical current density of two oxide thin films, one being subjected to both a hydrogen treatment and an oxygen treatment and the other being subjected to only the oxygen treatment.

A basic embodiment of this invention relates to an oxide superconductor including a Cu-O atomic layer. Examples of the oxide superconductors are a Y-Ba-Cu-O superconductor, a Bi-Sr-Ca-Cu-O superconductor, a Tl-Ba-Ca-Cu-O superconductor, and an Hg-Ba-Ca-Cu-O superconductor.

During the fabrication of the oxide superconductor, a crystalline oxide member which will form a target oxide superconductor is irradiated by reactive hydrogen such as activated hydrogen or hydrogen ions so that the oxide member and hydrogen react on each other. The hydrogen irradiation provides a hydrogen treatment. In addition, the oxide member is subjected to a heat treatment within an oxygen atmosphere or an activated oxygen gas. As a result, the oxide member is treated with oxygen. The hydrogen treatment and the oxygen treatment improve the crystallinity of the oxide member, and enable fine control of the oxygen concentration in the oxide member. The oxide member is made into the oxide superconductor through the hydrogen treatment and the oxygen treatment. Specifically, pinning centers against movement of magnetic flux are formed in the oxide superconductor as a result of the hydrogen treatment and the oxygen treatment, and the superconducting current density in the oxide superconductor is improved.

The hydrogen treatment is executed during or after the formation of the oxide member. For example, the formation of the oxide member is interrupted, and the hydrogen treatment is executed during the interruption of the formation of the oxide member.

The oxygen treatment facilitates the crystallization of the oxide member. The oxygen treatment feeds oxygen to the oxide member, changing the oxide member into a superconductor. The oxygen treatment is executed during the formation of the oxide member. For example, the formation of the oxide member is interrupted, and the oxygen treatment is executed during the interruption of the formation of the oxide member.

In some cases, the hydrogen treatment and the oxygen treatment are executed while the oxide member is heated. Generally, the hydrogen treatment is executed by a hydrogen irradiation source including a device for accelerating hydrogen ions. The hydrogen treatment and the oxygen treatment may be alternately repeated during the formation of the oxide member. The hydrogen treatment and the oxygen treatment may also be executed after the formation of the oxide member. The hydrogen treatment and the oxygen treatment realize a high-performance superconductor with a good controllability and a good stability.

The oxide superconductor may be of a thin-film configuration. The thin-film oxide superconductor is made by, for example, a vapor deposition process within a vacuum chamber. The hydrogen treatment is executed during or after the deposition of a desired oxide thin film which will form a target thin-film oxide superconductor. For example, the deposition of the oxide thin film is interrupted, and the hydrogen treatment is executed within the vacuum chamber during the interruption of the deposition of the oxide thin film. The oxygen treatment is executed during or after the deposition of the oxide thin film. In some cases, after the deposition of the oxide thin film has been completed, the oxide thin film is removed from the vacuum chamber and is then subjected to the hydrogen treatment and the oxygen treatment while being heated. The hydrogen treatment and the oxygen treatment realize a high-performance thin-film superconductor with good controllability and good stability. Specifically, the hydrogen treatment and the oxygen treatment enable a good superconducting critical current in the thin-film superconductor.

An oxide superconducting wire can be manufactured in a method according to the basic embodiment. In this case, the reactive hydrogen treatment and the oxygen treatment cause pinning centers with good controllability. In addition, it is possible to control the oxygen concentration in the oxide superconducting wire. The reactive hydrogen treatment to form pinning centers is executed as follows. Oxide powder which will form a target oxide superconductor is subjected to the reactive hydrogen treatment. The resultant oxide powder is placed into a sheath. The sheath with the oxide powder is narrowed (reduced in size) and elongated into a wire. The hydrogen treatment may be executed after the formation of the wire. In another alternative way, a process of narrowing and elongating the sheath with the oxide powder into a wire is interrupted, and the hydrogen treatment is executed during the interruption of the narrowing and elongating process. The oxygen treatment is executed during or after the process of narrow and elongating the sheath with the oxide powder into a wire. In an alternative way, the process of narrowing and elongating the sheath with the oxide powder into a wire is interrupted, and the oxygen treatment is executed during the interruption of the narrowing and elongating process. The hydrogen treatment and the oxygen treatment realize a high-performance superconducting wire with good controllability and good stability. Specifically, the hydrogen treatment and the oxygen treatment enable a good superconducting critical current in the superconducting wire.

A thin film of an oxide superconductor was fabricated. The hydrogen irradiation was executed during or after the formation of an oxide thin film. The oxygen treatment was executed during or after the hydrogen irradiation so that the oxygen concentration in the oxide superconductor was controlled. It was found that the hydrogen treatment and the oxygen treatment realized a high-performance thin-film superconductor with good controllability and good stability. Specifically, the hydrogen treatment and the oxygen treatment enabled a good superconducting critical current in the thin-film superconductor.

It is thought that the hydrogen irradiation excites valence electrons in the Cu-O bond orbits, and hence $O^{2-}$ is neutralized and is separated from the crystal. Thus, the Cu oxide is reduced, and there occur defects having deteriorated superconducting characteristics. The defects serve as pinning centers. It is thought that such pinning centers can occur in the Bi-based oxide superconductor and the Tl-based oxide superconductor as well as the Y-Ba-Cu-O superconductor.

It is preferable that the hydrogen treatment precedes the oxygen treatment. The hydrogen treatment forms non-superconducting regions in an oxide member and also defects in Cu-O plane portions of an oxide member which govern superconducting characteristics thereof. The oxygen treatment introduces oxygen into the defects, making the oxide member into a superconductor. Defects are caused with a good controllability at positions of oxygen atoms outside the Cu-O plane portions of the oxide member. It is thought that these defects serve as pining centers against movement of magnetic flux. In the case where the oxide member is heated at a high temperature during the oxygen treatment, a stable product can be obtained.

In the case of an oxide thin film, the hydrogen irradiation easily and reliably feeds hydrogen to the entire region of the thin film. In the case where the hydrogen treatment is executed each time the deposition of the thin film proceeds by a very small given thickness, the hydrogen treatment can use reactive hydrogen having a low acceleration energy. This case enables an improvement of the characteristics of the superconductor with a good uniformness, a good repeatability, a good controllability, and a good reliability.

A multi-core superconducting wire is manufactured according to the basic embodiment. Thin line cores are irradiated with reactive hydrogen (a hydrogen treatment), and are then subjected to an oxygen treatment so that hydrogen can be easily fed to the entire regions thereof. The thin line cores are combined and processed into a multi-core superconducting wire. The hydrogen treatment may be executed during the manufacture of the thin line cores. In this case, the hydrogen treatment can use the irradiation of reactive hydrogen such as hydrogen ion. This case enables an improvement of the characteristics of the superconducting wire with good uniformity, repeatability, controllability, and reliability.

DESCRIPTION OF A FIRST SPECIFIC PREFERRED EMBODIMENT

A first embodiment of this invention uses a device for a hydrogen treatment and a device for an oxygen treatment.

The hydrogen treatment device includes a hydrogen irradiation device. The hydrogen irradiation device may be of either a type using activated hydrogen or a type using hydrogen ions. Activated hydrogen and hydrogen ions can be generated by ultraviolet irradiation, rf excitation, rf discharge, or thermal decomposition using a high-temperature filament. The hydrogen irradiation device may include a hydrogen source having such a function of generating activated hydrogen or hydrogen ions.

A typical example of the oxygen treatment device is a furnace into which gas containing oxygen can be introduced. The hydrogen irradiation device can be used also for the oxygen treatment.

A thin film of an oxide including a Cu-O atomic layer was fabricated by sputtering. The oxide was made of, for example, Y-Ba-Cu-O, Bi-Sr-Ca-Cu-O, Tl-Ba-Ca-Cu-O, or Hg-Ba-Ca-Cu-O. The sputtering used a single-crystal substrate effective for making a highly-crystalline oxide thin film. The substrate was made of a single crystal of, for example, magnesium oxide, $LaAlO_3$, $LaGaO_3$, or strontium titanate.

In the case where an oxide thin film was deposited on the substrate, to provide a crystal structure having superconducting characteristics; it was preferable that the temperature of the substrate was equal to 300° C. or higher. It was most preferable that the temperature of the substrate was in the range of 500° C. to 850° C. The substrate temperature in this range was effective for optimizing the crystallinity, the composition, and the surface condition of an oxide thin film. A crystal structure of a thin-film oxide superconductor was made under such conditions for the fabrication of a thin film, and an oxide thin film having a thickness of about 1,000 Å was deposited on the substrate.

The resultant oxide thin film was placed into, for example, a hydrogen ion irradiation device. The oxide thin film was irradiated with hydrogen ion for 15 minutes under conditions where an acceleration voltage (an acceleration potential) was equal to 1 KV and a current density was equal to 0.6 mA/cm$^2$.

Before and after the hydrogen irradiation, experiments were performed on the oxide thin film to measure the properties thereof. The following facts were found from the experiments. The hydrogen irradiation caused a temperature-dependency of the resistivity of the oxide thin film to be similar to that of a semiconductor. Before the hydrogen irradiation, the resistivity of the oxide thin film was equal to about $10^{-4}$ ohm•cm at a superconducting critical temperature. After the hydrogen irradiation, the corresponding resistivity of the oxide thin film was equal to about 0.1 ohm•cm while the oxide thin film did not exhibit a superconducting zero-resistance.

After the hydrogen irradiation, the oxide thin film was placed into a furnace filled with oxygen gas. In the furnace, the oxide thin film was subjected to a heat treatment at a temperature of 800° C. for 5 hours while being exposed to the oxygen gas. Subsequently, the oxide thin film was cooled at a rate of 80° C./hour. In this way, an oxygen treatment was executed. The oxygen treatment enabled oxygen feed and improved the crystallinity of the oxide thin film.

A reference oxide thin film was made in a similar way including the heat treatment and the oxygen treatment but being exclusive of the hydrogen treatment.

Experiments were performed to measure the properties of the oxide thin film subjected to the hydrogen treatment and also the properties of the oxide thin film not subjected thereto (the reference oxide thin film). There was substantially no difference in superconducting transition temperature between the two oxide thin films. Regarding the reference oxide thin film, the superconducting critical current density was equal to $1.0 \times 10^5$ A/cm$^2$ at a temperature of 77 K. The superconducting critical current density in the oxide thin film subjected to the hydrogen treatment was better than that in the reference oxide thin film by a factor corresponding to about ten times.

FIG. 1 shows the results of the experiments which indicate the temperature dependencies of the critical current density of the two oxide thin films, that is, the oxide thin film subjected to the hydrogen treatment and the oxide thin film not subjected thereto (the reference oxide thin film). It was experimentally confirmed that although the degree of the improvement by the hydrogen treatment depended on the conditions of fabricating an oxide thin film, the advantage provided by the hydrogen treatment stably appeared in an oxide thin film having a good crystallinity. It is clear that such an advantage provided by the hydrogen treatment is also available in an oxide superconductor of a shape other than a thin film.

It is preferable that after an oxide thin film has been completed in a fabrication apparatus, the oxide thin film is not removed from a chamber of the fabrication apparatus and is subjected to the hydrogen treatment and the oxygen treatment in the chamber. It should be noted that if a Y-based oxide thin film is removed from the chamber before the hydrogen treatment and the oxygen treatment, water in air adheres to the surface thereof and reacts on elements in the thin film and therefore the superconducting characteristics tend to be decreased.

It was experimentally confirmed that thin-film oxide superconductors having high crystallinities were good in initial characteristics and long-term stability. In addition, it was confirmed that the control of the crystallinity and the oxygen concentration during or immediately after the formation of a thin film provided good superconducting characteristics.

The way of execution of the hydrogen treatment and the oxygen treatment is of four types (1), (2), (3), and (4). According to the first way (1), the hydrogen treatment and the oxygen treatment are executed simultaneously with the deposition of an oxide thin film. According to the second way (2), the deposition of an oxide thin film is interrupted, and the hydrogen treatment and the oxygen treatment are executed during the interruption of the deposition of the oxide thin film. In other words, the thin film deposition, the hydrogen treatment, and the oxygen treatment are periodically repeated. According to the third way (3), during the deposition of an oxide thin film in an oxygen atmosphere, only the hydrogen irradiation is executed. According to the fourth way (4), during the deposition of an oxide thin film in an oxygen atmosphere, the hydrogen treatment is executed for the oxygen feed and the hydrogen irradiation.

The first way (1) was actually performed. Specifically, during the deposition of an oxide thin film, the hydrogen irradiation was executed. Immediately after the deposition of the oxide thin film was completed, oxygen gas was introduced into a chamber of a thin-film fabrication apparatus and then a cooling process was performed so that the oxygen treatment was executed. It was confirmed that the first way (1) resulted in good superconducting characteristics. In addition, it was discovered that at temperatures in a given range, the hydrogen irradiation caused defects with a good controllability and the oxygen treatment caused an effective introduction of oxygen into a thin film. The given temperature range was higher than room temperature but equal to or lower than the substrate temperature which occurred during the deposition of the thin film. It was found that the efficiency and the simplicity were optimized when the hydrogen treatment and the oxygen treatment were executed for given times at temperatures in the given range. It was confirmed that such an advantage was also available in the second way (2). Desired temperatures at which the hydrogen treatment and the oxygen treatment were executed depended on elements composing an oxide thin film and conditions of the surface thereof. It was confirmed that the desired temperatures were in the range of 300° C. to 500° C. Desired flames, during which the hydrogen treatment and the oxygen treatment remained executed, depended on the type of an oxide thin film, the thickness thereof, and conditions of the surface thereof.

As previously described, according to the first way (1), the hydrogen treatment and the oxygen treatment are executed simultaneously with the deposition of an oxide thin film. According to the second way (2), the deposition of an oxide thin film is interrupted, and the hydrogen treatment and the oxygen treatment are executed during the interruption of the deposition of the oxide thin film. In other words, the thin film deposition, the hydrogen treatment, and the oxygen treatment are periodically repeated. It was preferable that the hydrogen treatment and the oxygen treatment in the first way (1) and the second way (2) used hydrogen gas, ions caused by the discharge of oxygen gas, and the irradiation of neutral atoms in an exited state.

For example, an ECR plasma generating device was used. A chamber of the plasma generating device was connected to the chamber of the thin-film fabrication apparatus. Gas containing hydrogen or oxygen was introduced into the chamber of the plasma generating device. Microwave was applied to the gas so that plasma occurred. A magnetic field was applied to the gas by a magnet to increase the probability of the occurrence of ionization. The plasma was fed to the chamber of the thin-film fabrication apparatus. It was found that neutral atom and ion in the plasma enabled efficient execution of the hydrogen treatment or the oxygen treatment.

The hydrogen treatment and the oxygen treatment may be executed after an oxide thin film is deposited and is removed from the chamber of the thin-film fabrication apparatus. In this case, an improvement of the critical temperature can be done in a short time, while the oxygen treatment requires more than ten hours regarding the critical current density. This fact means that the rate of the oxygen treatment depends on the diffusion of oxygen in the thin film, and the completion of the spread of oxygen over the entire region of the thin film takes a long time. Thus, the hydrogen treatment and the oxygen treatment can be effectively executed in a short time in the case where the hydrogen treatment and the oxygen treatment are executed simultaneously with the deposition of an oxide thin film according to the first way (1), or in the case where the deposition of an oxide thin film is interrupted, and the hydrogen treatment and the oxygen treatment are executed during the interruption of the deposition of the oxide thin film according to the second way (2). As previously described, in the second way (2), the thin film deposition, the hydrogen treatment, and the oxygen treatment are periodically repeated.

From the standpoint of the execution of the hydrogen treatment and the oxygen treatment, it is preferable that the hydrogen treatment and the oxygen treatment are executed simultaneously with the deposition of an oxide thin film. It was found that, in some types of the deposition of an oxide thin film, an adequate effect was unavailable since the treatment temperatures were limited to the deposition substrate temperature. Also, in some cases, high-energy particles provided adverse affection. As previously described, according to the second way (2), the deposition of an oxide thin film is interrupted, and the hydrogen treatment and the oxygen treatment are executed during the interruption of the deposition of the oxide thin film. In other words, the thin film deposition, the hydrogen treatment, and the oxygen treatment are periodically repeated. It was confirmed that the second way (2) provided a good effect.

During the deposition of an oxide thin film, deposited elements are in excited states immediately after the deposition thereof. In some cases, it takes several minutes for excited elements to fall into stable states. During some types of the deposition of an oxide thin film having a laminated structure, the deposition is interrupted to attain stabilization each time the deposition proceeds by one period of the laminated structure. Provided that the hydrogen treatment and the oxygen treatment are carried out during such an interruption of the deposition, ideal hydrogen treatment and oxygen treatment can be completed in a short time. It was confirmed that a thin film oxide superconductor having good characteristics was obtained by interrupting the deposition at given intervals (periods), and executing the hydrogen treatment and the oxygen treatment during the interruption of the deposition. A preferable interruption interval (period) was equal to a length of time during which the deposition proceeded by a film thickness of 500 Å or less.

Figure 2:
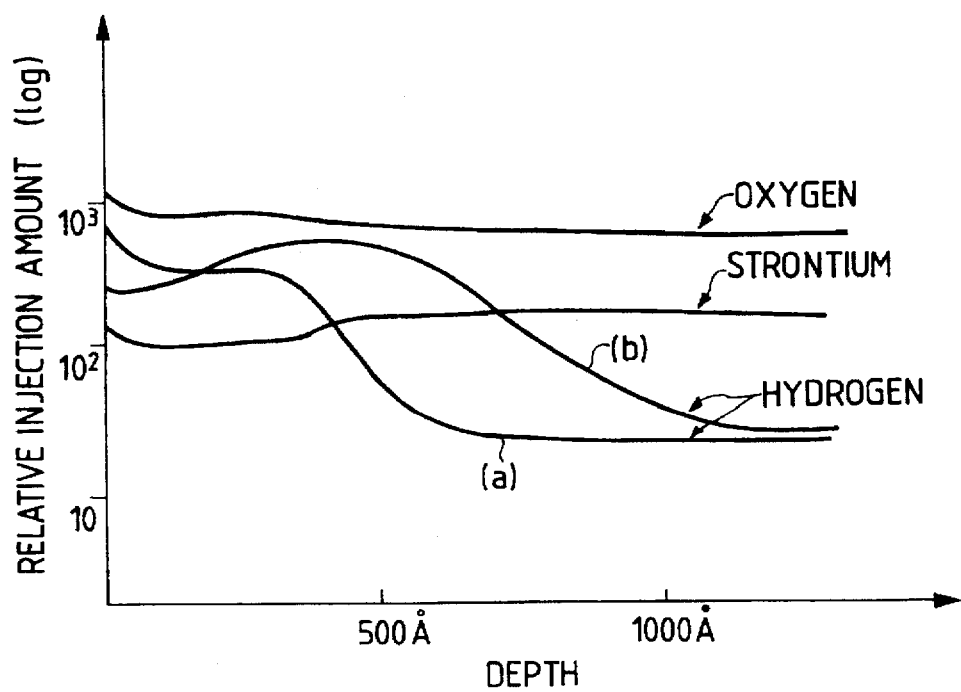
FIG. 2 is a diagram of a compositional depth profile of a thin-film oxide superconductor.

The hydrogen irradiation was executed on a thin film of a Bi-based oxide superconductor under the previously-mentioned conditions. Experiments were performed on the resultant thin film of the Bi-based oxide superconductor to measure the properties thereof. FIG. 2 shows the results of experiments which indicate the relation between the relative amount of hydrogen and the depth in the thin film. At an acceleration voltage of 1 KV, as denoted by the curve (a) in FIG. 2, hydrogen is uniformly injected into a region of the thin film between the surface and a place with a depth of 300 Å. At an acceleration voltage of 5 KV or higher, as denoted by the curve (b) in FIG. 2, hydrogen is injected into a deeper portion of the thin film but the uniformness of the injection along the depth is deteriorated.

Hydrogen ions accelerated by low energy is effective in the hydrogen irradiation. An irradiation device using such low-energy hydrogen ions is generally suited to the attachment to the thin-film fabrication apparatus. It was confirmed that an acceleration voltage of 5 KV or less provided an good effect.

It was confirmed that the hydrogen treatment improved the superconducting critical current also in a Bi-based oxide superconductor or a Tl-based oxide superconductor. In addition, it was confirmed that the hydrogen treatment improved the superconducting critical current in a Y-based oxide superconductor containing Ln (atomic numbers of 63–71).

It is thought that when the acceleration voltage is low during the hydrogen irradiation, hydrogen does not reach a deep portion of the thin film and thus stays in a surface portion of the thin film. In this case, hydrogen affects only the surface portion of the thin film. On the other hand, when the acceleration voltage is high, hydrogen can uniformly affect the entire region of the thin film.

Generally, a source for generating activated hydrogen uses a small-size ion gun, an rf excitation process, or an ECR plasma process. An improvement of the critical current can be expected by using the generation source for activated hydrogen during the fabrication of the oxide thin film.

Figure 3:
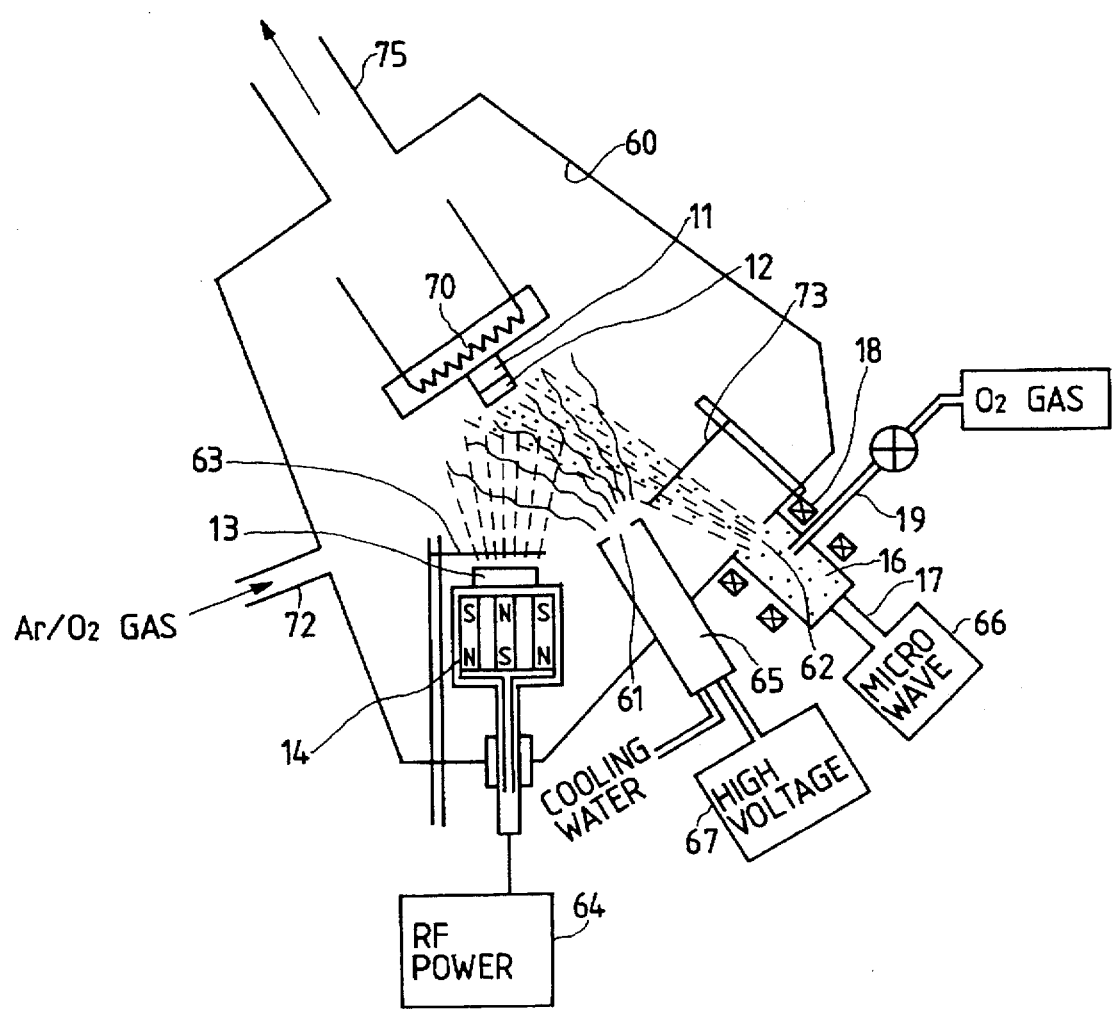
FIG. 3 is a sectional diagram of an apparatus for fabricating a thin-film oxide superconductor according to a first specific embodiment of this invention.

FIG. 3 shows a system used in the case where the hydrogen treatment and the oxygen treatment are executed as portions of the process of fabricating an oxide thin film. The system of FIG. 3 includes a thin-film fabrication vacuum chamber 60 in which a vaporization source is disposed. A hydrogen feed opening 61 and an oxygen feed opening 62 communicate with the chamber 60. The system includes a hydrogen irradiation device and an oxygen treatment device connected to the camber 60.

The vaporization source is an rf magnetron sputtering device including a target 13, a magnetron cathode 14, a shutter 63, and an rf power supply 64. The hydrogen irradiation device is a hydrogen ion gun 65 having the hydrogen feed opening 61. The hydrogen ion gun 65 is activated by a high-voltage power supply 67. The hydrogen ion gun 65 is supplied with cooling water. The oxygen treatment device is an ECR oxygen plasma generator having the oxygen feed opening 62. The ECR oxygen plasma generator includes a plasma generation chamber 16, a magnet 18, and a microwave power supply 66. The microwave power supply 66 is connected to the plasma generation chamber 16 via a waveguide 17. Oxygen gas can be supplied to the plasma generation chamber 16 via a pipe 19.

A substrate 11 placed on a stage in the chamber 60 can be heated by a heater 70. An oxide thin film 12 can be deposited on the substrate 11. The shutter 63 can move into and from a closed position which lies between the target 13 and the substrate 11. A shutter 73 can move into and from a closed position between the oxygen feed opening 62 and the substrate 11. A passage 72 communicating with the chamber 60 serves to introduce a mixture of argon gas and oxygen gas into the chamber 60. A passage 75 connects the chamber 60 and a vacuum source such as a vacuum pump (not shown).

According to a modification of the system of FIG. 3, the chamber 60 is separated and a load lock mechanism is provided. In addition, the substrate 11 can be moved together with a holder.

The oxygen treatment was executed by an ECR plasma process under the following conditions. The microwave power was equal to 200 W. The gas pressure was equal to $8.5 \times 10^{-4}$ Torr. The bias voltage was equal to 50 V. The hydrogen process was executed by a small-size ion gun of the Kaufman type where the acceleration voltage was set to 2 KV. According to an alternative way, the oxygen treatment was executed by an ozonizer of the rf excited type. Specifically, the ozonizer was fed with oxygen gas with being driven by an rf power of 800 W so that the oxygen gas was converted into gas containing ozone. The gas containing ozone was supplied to the vacuum chamber of the thin-film fabrication apparatus.

In the case where the thin film deposition, the hydrogen treatment, and the oxygen treatment were periodically repeated, that is, in the case where the second way (2) was executed, the following conditions were adopted. The thickness of an oxide thin film which was deposited during one period was equal to about 100 Å. The duration (the time) of the hydrogen treatment was equal to about 5 minutes. The duration (the time) of the oxygen treatment was equal to about 72 seconds. When the deposition of an oxide thin film was executed in an atmosphere containing oxygen, the duration of the oxygen treatment can be short.

It was confirmed that the combinations of the thin film deposition process, the hydrogen treatment, and the oxygen treatment according to the first way (1), the second way (2), and the fourth way (4) provided transition temperatures of oxide thin films higher than those of oxide thin films made without any hydrogen treatment and oxygen treatment. In addition, the combinations of the thin film deposition process, the hydrogen treatment, and the oxygen treatment according to the first way (1), the second way (2), and the fourth way (4) provided critical current densities in oxide thin films greater than those in oxide thin films made without any hydrogen treatment and oxygen treatment. It was found that, under certain conditions, the third way (3) resulted in a change of the composition of an oxide thin film and a lowered crystallinity of the oxide thin film. Even the third way (3) can provide an improvement of characteristics of an oxide thin film by optimizing the conditions thereof.

It is made clear from the previous description that this embodiment can improve the critical current densities in a thin-film superconductor of the Bi-Sr-Ca-Cu-O system and a thin-film superconductor of the Tl-Ba-Ca-Cu-O system. Since this embodiment is based on the reaction of hydrogen and oxygen, it is thought that this embodiment is effective in other oxide superconductors containing Cu-O atomic layers.

EXAMPLE

A substrate was made of a (100)-oriented single crystal of magnesium oxide. A target was made of sintered material for a high-Tc oxide superconductor of Bi-Sr-Ca-Cu-O. According to an rf planar magnetron sputtering technique, the target was subjected to a sputtering vaporization process within an atmosphere of a mixture of Ar and $O_2$ so that a crystalline thin film of Bi-Sr-Ca-Cu-O was deposited on the substrate.

Conditions of the sputtering process were as follows. The gas pressure was equal to 0.4 Pa. The sputtering power was equal to 160 W. The sputtering time was equal to 30 minutes. The substrate 11 was heated at a temperature of 600° C. by a heater. The resultant thin film had a thickness of 0.5 μm.

The thin film was divided into halves. A first half of the thin film was subjected to a hydrogen treatment while a second half thereof was not.

The first half of the thin film was placed on a stage in an ion irradiation device. The temperature of the stage was set to a value in the range of 10° C. to 500° C. Hydrogen ions were generated from an ion source of the Kaufman type, being accelerated by a voltage (a potential) of 300 V to 2 KV and being applied to the first half of the thin film.

Then, the first half of the thin film was moved from the ion irradiation device to a heat treatment furnace. The first half of the thin film was in an oxygen-containing atmosphere filling an interior of the heat treatment furnace. The first half of the thin film was subjected to a heat treatment at a temperature of 700° C. to 900° C. while being exposed to the oxygen-containing atmosphere. In this way, the first half of the thin film was subjected to an oxygen treatment. Then, the first half of the thin film was cooled at a rate of 100° C./hour or less. The first half of the thin film was moved from the heat treatment furnace. The resultant first half of the thin film was used as a first sample.

The second half of the thin film was subjected to an oxygen treatment similar to the oxygen treatment on the first half of the thin film but was not subjected to a hydrogen treatment. The resultant second half of the thin film was used as a second sample.

Experiments were performed on the first sample which was fabricated through the hydrogen treatment under the following conditions. The stage temperature (the substrate temperature) was equal to 100° C. The acceleration voltage (the acceleration potential) was equal to 1 KV. The ion irradiation amount was equal to $2.5 \times 10^{18}/cm^2$. Similar experiments were performed on the second sample. The properties of the first sample and the second sample were measured during the experiments.

Regarding the second sample, the superconducting critical current density was equal to $1.0 \times 10^5 A/cm^2$ at a temperature of 77 K. The superconducting critical current density in the first sample at a temperature of 77 K was better than that in the second sample by a factor corresponding to about ten times.

The first sample and the second sample were similar in crystallinity and composition. X-ray diffraction patterns of the first sample and the second sample indicated that good crystalline oxides of $Bi_2Sr_2Ca_2Cu_3O_y$ were made. There was substantially no difference between the x-ray diffraction patterns of the first sample and the second sample.

Thus, it was experimentally confirmed that the hydrogen treatment improved the critical current density without changing the crystal structure.

DESCRIPTION OF A SECOND SPECIFIC PREFERRED EMBODIMENT

Figure 4:
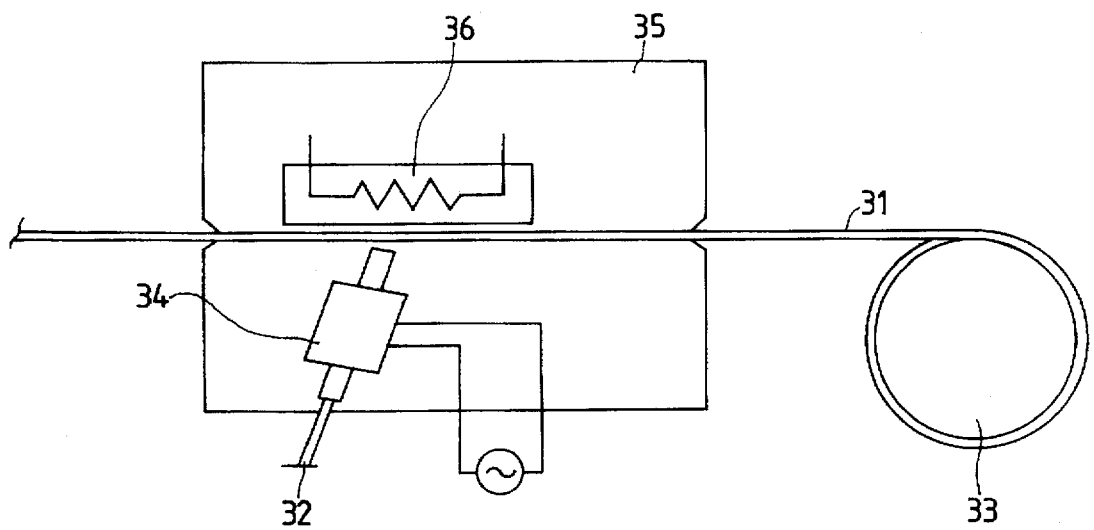
FIG. 4 is a sectional diagram of an apparatus for manufacturing a superconducting wire according to a second specific embodiment of this invention.

With reference to FIG. 4, a superconducting wire 31 contains an oxide superconductor including a Cu-O layer.

Examples of the oxide superconductor are a Y-Ba-Cu-O Superconductor, a Bi-Sr-Ca-Cu-O superconductor, a Tl-Ba-Ca-Cu-O superconductor, and an Hg-Ba-Ca-Cu-O superconductor.

The winding device 33 serves to move the superconducting wire 31 which extends through a reaction chamber 35. In the reaction chamber 35, the superconducting wire 31 is treated with reactive hydrogen generated by a reactive hydrogen generator 34. A heater 36 disposed in the reaction chamber 35 serves to heat the superconducting wire 31.

A hydrogen gas is fed to the reactive hydrogen generator 34 via an inlet 32. The hydrogen gas is activated into a reactive hydrogen gas by the reactive hydrogen generator 34. In the reaction chamber 35, the resultant reactive hydrogen gas is applied to the superconducting wire 31 from the reactive hydrogen generator 34. The superconducting wire 31 is continuously treated by the reactive hydrogen gas while being heated by the heater 36. In this way, a hydrogen treatment is performed on the superconducting wire 31.

The hydrogen treatment is followed by an oxygen treatment. Specifically, an oxygen gas is activated by a suitable device, and the resultant activated oxygen gas is introduced into the reaction chamber 35. The superconducting wire 31 is treated by the activated oxygen gas while being heated by the heater 36. In this way, the oxygen treatment is performed on the superconducting wire 31.

The hydrogen treatment and the oxygen treatment improve the superconducting critical current density in the superconducting wire 31.

In the case of an oxide superconductor of the Bi-Sr-Ca-Cu-O system, it was found that the temperature range of 400° C. to 900° C. was good to provide a crystal structure having superconducting characteristics. The temperature at which the crystallinity and the composition of the oxide were optimized was in this temperature range.

A crystal structure of an oxide superconductor was made under such fabricating conditions, and an oxide member was thus fabricated. The oxide member was placed into, for example, a hydrogen ion irradiation device. The oxide member was irradiated by hydrogen ion for 15 minutes under conditions where an acceleration voltage (an acceleration potential) was equal to 1 KV and a current density was equal to 0.6 mA/cm$^2$.

Before and after the hydrogen irradiation, experiments were performed on the oxide member to measure the properties thereof. The following facts were found from the experiments. The hydrogen irradiation caused a temperature dependency of the resistivity of the oxide member to be similar to that of a semiconductor. Before the hydrogen irradiation, the resistivity of the oxide member was equal to about $10^{-4}$ ohm•cm at a superconducting onset critical temperature. After the hydrogen irradiation, the corresponding resistivity of the oxide member was equal to about 0.1 ohm•cm while the oxide thin film did not exhibit a superconducting zero-resistance.

After the hydrogen irradiation, the oxide member was placed into a furnace filled with oxygen gas. In the furnace, the oxide member was subjected to a heat treatment at a temperature of 840° C. for 50 hours while being exposed to the oxygen gas. Subsequently, the oxide member was cooled at a rate of 80° C./hour. In this way, an oxygen treatment was executed. The oxygen treatment enabled oxygen feed and improved the crystallinity of the oxide member.

Experiments were performed to measure the properties of various samples of oxide members. It was confirmed from the results of the experiments that an optimal fabrication temperature range was actually present to provide a crystal structure having superconducting characteristics. In addition, it was confirmed that the temperature at which the crystallinity and the composition of an oxide member were optimized was actually in this temperature range.

A reference oxide member was made in a similar way including the heat treatment and the oxygen treatment but being exclusive of the hydrogen treatment.

Experiments were performed to measure the properties of the oxide member subjected to the hydrogen treatment and also the properties of the oxide member not subjected thereto (the reference oxide member). There was substantially no difference in superconducting transition temperature between the two oxide members. At a temperature of 77 K, the superconducting critical current density in the oxide member subjected to the hydrogen treatment was better than that in the reference oxide member by a factor corresponding to about ten tames. It was confirmed that although the degree of the improvement by the hydrogen treatment depended on the conditions of fabricating an oxide member, the advantage provided by the hydrogen treatment more stably appeared in an oxide thin film having a better crystallinity.

The hydrogen treatment and the oxygen treatment are executed as portions of a process of manufacturing a superconducting wire. The hydrogen treatment can be incorporated into the process of manufacturing a superconducting wire in various ways. According to a first way, a sheath charged with oxide powder is rolled into a wire, and the hydrogen treatment is performed on the wire. According to a second way, the hydrogen treatment is performed on oxide wire, and then the oxide wire is placed into a sheath. It was experimentally confirmed that superconducting wires manufactured in the first and second ways were better in characteristics than a superconducting wire not subjected to the hydrogen treatment. For example, during the hydrogen treatment, the wire is irradiated with hydrogen ton after being exposed to a rolling process. The hydrogen ion irradiation may be executed during the rolling process.

Figure 5:
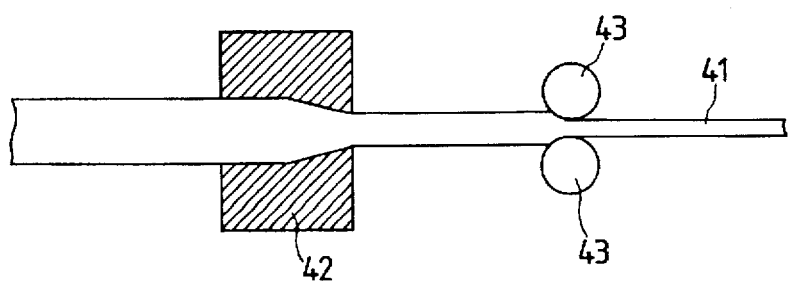
FIG. 5 is a sectional diagram of an apparatus for manufacturing a superconducting wire.

In typical cases, superconducting oxide powder is placed into a metal pipe, and the metal pipe with the superconducting oxide powder is narrowed (reduced in size) and made into a wire. The wire may be of a tape shape. FIG. 5 shows an apparatus for manufacturing a tape-shaped superconducting wire. Crystal grains in the superconducting oxide powder have plate configurations. As shown in FIG. 5, the metal pipe with the superconducting oxide powder is pressed and made into a tape-shaped wire by a rolling device or a pressing device. During this process, the metal pipe is pressed in one direction so that crystal planes of grains in the superconducting oxide powder can be substantially parallel to each other. A superconducting wire manufactured via these steps has good crystallinity and improved superconducting characteristics. It is thought that although the superconducting wire is polycrystalline, each crystal grain has an improved crystallinity. It was confirmed that the advantage provided by the hydrogen treatment more stably appeared in an oxide member having a better crystallinity. It was also confirmed that the good crystallinity of the superconducting wire enhanced the advantage provided by the hydrogen treatment.

EXAMPLE

A mixture of $Bi_2O_2$ powder, SrO powder, CaO powder, and CuO powder is placed into a crucible. The powder mixture is preliminarily fired (sintered) in an oxygen gas flow at a temperature of 860° C. for 10 hours. The resultant fired (sintered) block is removed from the crucible, and is reduced to powder. The powder is placed back to the crucible. The powder is finally fired (sintered) at a temperature of 800° C. to 900° C. for 1 to 5 hours. The resultant fired (sintered) block is removed from the crucible, and is reduced to powder again. The powder is spread over a cathode plate in a vacuum chamber, being heated at a temperature of 150° C. and being irradiated with ionized hydrogen accelerated by a voltage (a potential) of 2 KV. In this way, a hydrogen treatment is performed on the powder. The resultant powder is used as material powder.

The material powder is placed into a metal pipe. The metal pipe with the material powder is made into a wire by mechanical processing, and the wire is subjected to a heat treatment so that the wire forms a superconducting wire. This process of manufacturing a superconducting wire is based on a Kunzler technique. Specifically, a sliver pipe having an outside diameter of 10 mm and a wall thickness of 0.5 mm is charged with the material powder at a density of about 3 g/cm$^2$. As shown in FIG. 5, the silver pipe with the material powder is narrowed (reduced in size) to a diameter of 3.0 mm by a wire swager 42. Then, the narrowed silver pipe with the material powder is processed by rollers 43 into a tape shape having a thickness of 0.1 mm or less. The resultant tape-shaped wire is heated at a temperature of 810° C. in an oxygen atmosphere. Thus, the tape-shaped wire is subjected to an oxygen treatment. After the oxygen treatment, the tape-shaped wire forms a final superconducting wire.

A superconducting wire may also be manufactured in the following way. Material powder is prepared without being subjected to a hydrogen treatment. The material powder is placed into a metal pipe. The metal pipe with the material powder is narrowed (reduced) in diameter by the wire swager 42 while being subjected to the hydrogen treatment. Specifically, the narrowing of the metal pipe is executed within a hydrogen atmosphere so that the narrowing of the metal pipe and the hydrogen treatment are simultaneously executed. Then, the narrowed metal pipe with the material powder is processed by the rollers 43 into a tape shape. The resultant tape-shaped wire is heated in an oxygen atmosphere. Thus, the tape-shaped wire is subjected to an oxygen treatment. After the oxygen treatment, the tape-shaped wire forms a final superconducting wire.

It should be noted that the hydrogen treatment may be executed after the narrowed metal pipe with the material powder is formed. In this case, the narrowed metal pipe with the material powder is placed in a hydrogen irradiation device, and is then irradiated with hydrogen.

It was discovered that at temperatures in a given range, the hydrogen treatment and the oxygen treatment provided good effects. The given temperature range was equal to or higher than room temperature. It was found that the efficiency and the simplicity were optimized when the hydrogen treatment and the oxygen treatment were executed for given times at temperatures in the given range. Desired temperatures at which the hydrogen treatment and the oxygen treatment were executed depended on elements composing a superconducting wire. In the case of wires of composite oxide superconductors, the desired temperatures were in the range of 400° C. to 900° C. Desired times, during which the hydrogen treatment and the oxygen treatment remained executed, depended on the type and the diameter of a superconducting wire.

A multi-core wire is manufactured as follows. Line cores are manufactured in a way similar to the above-mentioned way of manufacturing the superconducting wire. The total number of the line cores is equal to 10 to 100. The line cores are placed into a silver sheath. The silver sheath with the line cores is narrowed (reduced) in diameter, and is then rolled into a tape shape. In this way, a tape-shaped multi-core wire is made. During the manufacture of the line cores, each of the line cores is subjected to a hydrogen treatment. After the multi-core wire has been made, an oxygen treatment is performed on the multi-core wire so that the multi-core wire forms a good superconducting wire.

The multi-core wire may also be manufactured as follows. Line cores are subjected to a hydrogen treatment and an oxygen treatment. Then, the line cores are placed into a silver sheath. The silver sheath with the line cores is narrowed (reduced) in diameter, and is then rolled into a tape shape.

In the case of a multi-core wire, each line core is relatively thin. Thus, the hydrogen treatment uses hydrogen irradiation executed in a short time.

What is claimed is:

1. A method of fabricating an oxide superconductor containing a Cu-O atomic layer, comprising the steps of:

forming an oxide superconductor precursor which forms the oxide superconductor containing a Cu-O atomic layer;

hydrogenating the oxide superconductor precursor by irradiating the oxide superconductor precursor with reactive hydrogen after the forming step; and oxidizing the oxide superconductor precursor after the hydrogenating step;

wherein the hydrogenating step comprises accelerating hydrogen ions by a voltage of 5 KV or lower, and applying the accelerated hydrogen ions to the oxide to improve current density.

2. The method of claim 1, wherein the oxidizing step comprises heating the oxide at a temperature of 400° C. to 900° C.

3. A method of fabricating an oxide superconductor containing a Cu-O atomic layer, comprising the steps of:

forming an oxide superconductor precursor which forms the oxide superconductor containing a Cu-O atomic layer;

hydrogenating the oxide superconductor precursor by irradiating the oxide superconductor precursor with reactive hydrogen during the forming step; and oxidizing the oxide superconductor precursor after the hydrogenating step, wherein the oxidizing step is carried out during or after the forming step;

wherein the hydrogenating step comprises accelerating hydrogen ions by a voltage of 5 KV or lower, and applying the accelerated hydrogen ions to the .oxide to improve current density.

4. The method of claim 3, wherein the oxidizing step comprises heating the oxide at a temperature of 400° C. to 900° C.

* * * * *